AUTOMATIC FREQUENCY STABILIZING CIRCUIT

Filed Jan. 31, 1963 3 Sheets-Sheet 1

INVENTOR.
JACQUES CAYZAC
BY
Frank R. Trifari
AGENT

INVENTOR.
JACQUES CAYZAC
BY
Frank R. Trifari
AGENT

INVENTOR.
JACQUES CAYZAC
BY
Frank R. Trifari
AGENT

United States Patent Office 3,231,820

Patented Jan. 25, 1966

3,231,820

AUTOMATIC FREQUENCY STABILIZING CIRCUIT

Jacques Cayzac, La Varenne, France, assignor to North American Philips Company, Inc., New York, N.Y., a corporation of Delaware Filed Jan. 31, 1963, Ser. No. 255,342

Claims priority, application France, Feb. 16, 1962, 888,293

9 Claims. (Cl. 325—148)

The invention relates to an automatic frequency stabilizing circuit, particularly a stabilizing circuit for the central frequency of a frequency modulation generator.

A number of circuits have been proposed to accomplish this result. Each of the proposed circuits are capable of supplying an error voltage which varies the characteristic curve of the tuning circuit of the frequency-modulation generator. This error voltage is derived from a comparison signal between the central frequency of the signal supplied by said generator and the frequency of a reference signal supplied by a quartz oscillator. This type of stabilizing circuit however has a few disadvantages which make it impractical.

With some of the arrangements the error voltage is derived from a discriminator and the stabilization of the central frequency of the frequency-modulation generator depends upon the stability and the linearity of the discriminator circuits. In order to obtain linear stable operation the elements comprising the circuit must be accommodated in an envelope of constant temperature or a quartz element is joined to said elements. The manufacture of such circuits is complex and costly.

It has also been proposed to use circuits without discriminators. With one of the proposed circuits the frequency-modulated signal and the reference signal are fed to the input of a mixing circuit. A low bandpass filter selects the output frequencies of the mixing circuit in a narrow band lying symmetrically on either side of the central frequency. If the central frequency of the frequency-modulated signal and the central frequency of the reference signal are equal to each other, the frequency sweeps on either side of the central frequency of the mixing circuit are divided into equal time intervals. A symmetric limiter then cuts off the lower parts and upper of the filtered signal. Subsequently, this signal is integrated for supplying an error signal and has the value zero, when the two signals at the input of the mixing circuit have the same frequency, but it is positive or negative according to the sense of the sweep, if the frequencies differ from each other. Such an arrangement, however, is unsatisfactory in the case of a low modulation percentage, owing to the presence of the low bandpass filter involving a reduced cutoff frequency. The interpretation of the signal supplied by the mixing circuit is performed only with difficulty, particularly in the case of high modulation frequencies.

With other arrangements the reference wave and the frequency-modulated wave to be stabilized are fed to the inputs of two modulators M1 and M2 i.e. the first directly and the second to the input of M1 with a phase shift of 90° relative to the input of M2. The output signals of M1 and M2 are fed to the input of a third modulator M3 with a phase shift of 90° for M1 and directly to M2. The modulator M3 is coupled with the generator to be stabilized via a low bandpass filter.

In order to obtain a sensitive control, it is, however, necessary for the limit frequency of the second phase-shifting circuit to be very low, since the phase shift appears already with very small variations. This is, however, not compatible with the permeability for high modulation frequencies.

The invention has for its object to provide a stabilizing arrangement for the central frequency of a frequency-modulation generator, in which no discriminator is required and which is particularly suitable for stabilizing a frequency-modulated wave with a low modulation index (frequency sweep) and with high modulation frequency. In contrast to the arrangements comprising a discriminator, the accuracy of the operation of such a circuit is not varied with a large frequency sweep. The automatic frequency stabilizing circuit according to the invention, comprising a stable frequency oscillator, e.g. a quartz oscillator which supplies a reference signal which together with the signal supplied by the frequency-modulation generator, is supplied to the input of a mixing circuit, is characterized essentially in that the signals thus obtained are passed through a filter circuit, which brings about an attenuation varying inversely with the frequency and which is connected between the output of the said mixing circuit and two parallel switching circuits, the latter being connected to detection circuits so that the last-mentioned circuits are rendered operative alternately during the positive and negative half cycles of the modulation signal and are both connected to an adder circuit, which supplies an error signal for frequency readjustment of the frequency-modulation generator.

The characteristic curve of the correction circuit, which has the same effect for the two detection circuits, is thus compared with itself, so that the frequency sweep between the frequency of the reference signal and the central frequency of the modulated signal is accurately determined.

The correction circuit is, in addition, favorable to the limit frequencies of the deviation of the signal supplied by the mixing circuit. It is then possible to correct the central frequency of a frequency-modulation generator. If the modulation index is low i.e. when the frequency sweep does not exhibit a large range, it is necessary to determine accurately the limits of the sweep. In certain cases, however, such as when the modulation frequency is high, the energy of the signal supplied by the mixing circuit is not sufficient to obtain the correct operation of such a circuit.

According to a further aspect of the invention an oscillator of very low frequency is added in those cases, the output circuit of which is coupled with the control-circuit of the frequency-modulation generator via a superheterodyne circuit, to which also the modulation signal is fed and which is coupled on the other hand with the two detection circuits so that the signal supplied thereby renders the circuits alternately conducting in the rhythm of the periods.

It may occur, however, that the transmission of a pilot wave, supplied for example by the low-frequency oscillator, is not desirable.

According to a variant of the automatic frequency-stabilization circuit the quartz oscillator has added to it a phase modulation circuit, to which the signal of an auxiliary oscillator of lower frequency is fed so that the said reference oscillation is phase-modulated, while the signal supplied by the low-frequency oscillator is also supplied to the input of a superheterodyne circuit, which receives on the other hand the modulation signal, the output of the said superheterodyne circuit is coupled with the two detection circuits so that the latter are rendered alternately conducting in the rhythm of the periods of the modulation signal superimposed on the signal supplied by the low-frequency oscillator.

The invention will now be described more fully with reference to the accompanying drawing, in which—

Figure 1:
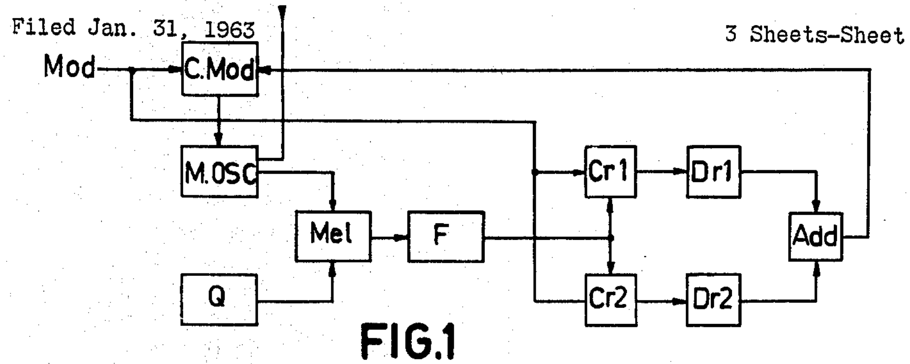
FIG. 1 illustrates the principal diagram of the automatic frequency stabilization circuit according to the invention.

FIG. 1 shows the master oscillator MO*sc*, which constitutes essentially the frequency-modulation generator to be stabilized. The circuit MO*sc* is coupled on the one hand with the control-modulation circuit CM*od*, to which the modulation signal is supplied and on the other hand with the mixing circuit M*el*. A quartz oscillator Q, which supplies the reference signal, is also connected to the mixing circuit M*el*. The beat signal of the latter is fed to the input of a filter F, which supplies a signal, the level of which is inversely proportional to the frequency of the beat signal. The filter signal is fed in parallel to the inputs of two detection circuits D*r*1, D*r*2 via two switching circuits C*r*1 and C*r*2 respectively. The signals derived from the outputs of the detection circuits D*r*1 and D*r*2 are fed to the input of an adder circuit A*dd*, the output signal of which is, transmitted to the control-modulation circuit CM*od*. On the other hand the modulation signal is also supplied to the input of the switching circuits C*r*1 and C*r*2. The automatic frequency stabilization circuit thus obtained operates as follows.

Figure 2:
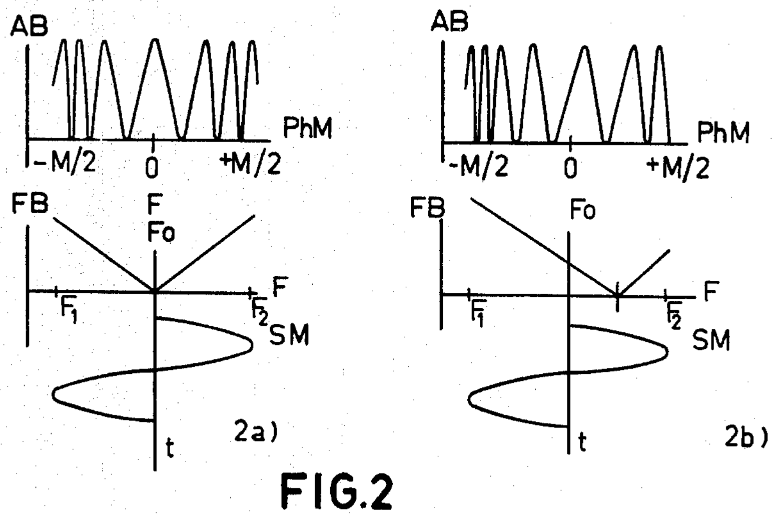
FIGS. 2, 3 and 4 show diagrams for explaining the operation of the said circuit.
Figure 3:
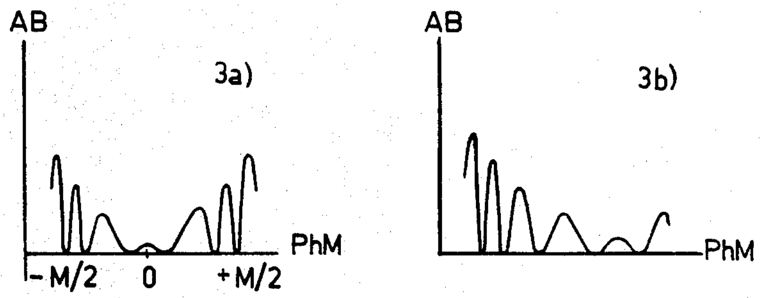

It will be assumed that the frequency-modulated wave, which is derived from the output of the circuit MO*sc*, varies in its central frequency in a very slow rhythm as compared with the limit frequency of the beat signal at the output of the mixing circuit M*el* and that the central frequency F*o* of the signal derived from the circuit MO*sc* is equal to the frequency of the reference signal F of the quartz oscillator Q, so that the limit frequencies F1 and F2 are equal, which is illustrated in FIG. 2*a*, in which SM designates the modulation signal as a function of time, *t*, AB the waveform of the beat signal as a function of the phase of the modulation signal and FB the frequency variation of the said beat signal also as a function of the phase of the modulation signal. If, however, the frequencies F*o* and F are different, also the frequencies F1 and F2 will be different, so that the range of the beat frequency on either side of F*o* is not symmetrical (see FIG. 2*b*). The beat signals thus obtained are subjected to the filter F, so that an attenuation is obtained, which is inversely proportional to frequency and the lack of symmetry of the frequency of the signal supplied by the circuit M*el* is converted into an amplitude difference. FIG. 3 illustrates the waveform of the signal at the output of the filter F, when $Fo=F$ (FIG. 3*a*) and when $Fo\neq F$ (FIG. 3*b*) as a function of the phase of the modulation signal.

Figure 4:
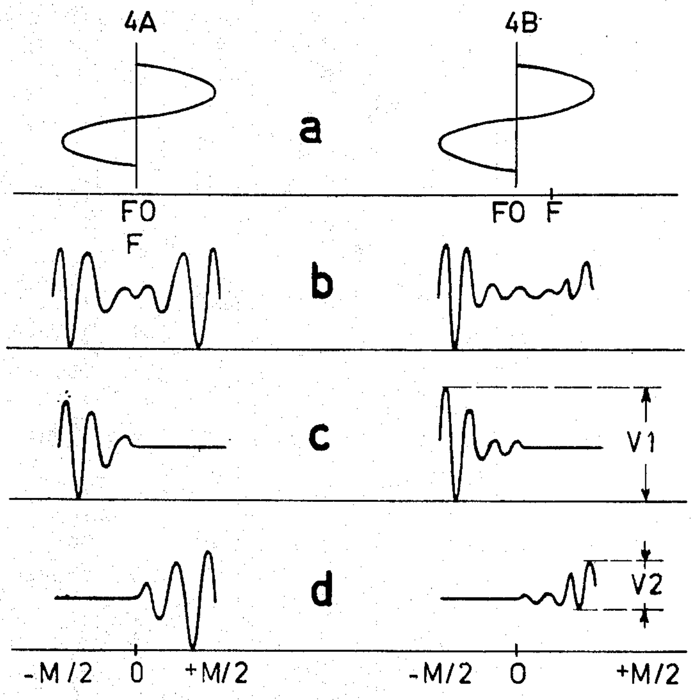

The beat signal is fed in parallel to the inputs of the two circuit switching circuits C*r*1 and C*r*2. Said circuits have the function of a coincidence circuit and are rendered conducting for the beat signal by the control of the modulation signal fed thereto. The switching circuit C*r*1, for example, is constructed so that it transmits the beat signal during the positive half period of the modulation signal. The switching circuit C*r*2, however, is constructed so that it transmits the beat signal during the negative half period of the modulation signal. The signals transmitted by the circuits C*r*1 and C*r*2 are detected by the circuits D*r*1 and D*r*2. The waveform of the signals at the outputs of the various circuits of the frequency stabilizer is illustrated in FIG. 4.

FIGS. 4A*a*, 4A*b*, 4A*c* and 4A*d* illustrate the waveforms of the modulation signal, of the output signal of the filter F, of the output signal of the detection circuit D*r*1 and of the output signal of the detection circuit D*r*2, when $F=Fo$. FIGS. 4B*a*, 4B*b*, 4B*c* and 4B*d* illustrate the same signals when $F\neq Fo$.

It will be seen from FIGS. 4B*c* and 4B*d* that the voltage amplitude V1 of the signal obtained from the output of the detection circuit D*r*1 is considerably higher than that of the signal V2 obtained from the output of the detection circuit D*r*2, although part of the signal of the detection circuit D*r*1 is transmitted to the detection circuit D*r*2 owing to the displacement introduced by the frequency shift during the commutation. To this end it is required to subject the output information only to that part of the signal, which corresponds to the frequency providing the maximum amplitude, which involves that detectors having a high time constant must be employed.

Figure 5:
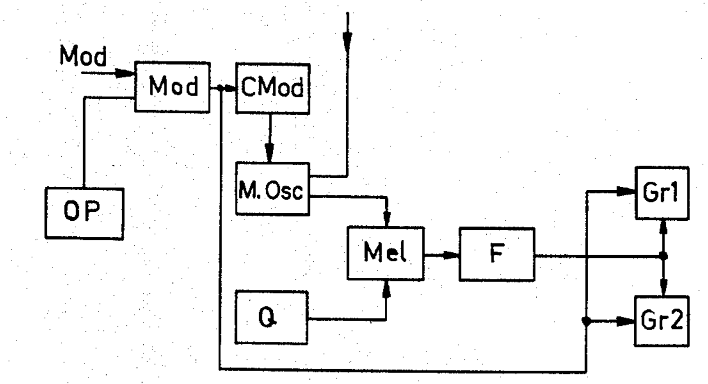
FIG. 5 illustrates the principal diagram of the automatic frequency stabilization circuits for the transmission of a pilot signal superimposed on the modulation signal.

It may, however, occur that the modulation index is too low in order to obtain a useful energy by beat signals. It is, in fact, necessary, in the case of a given deviation corresponding to a beat frequency *f* to have an adequate interrogation time available, in order to allow the frequencies approaching the value *f* to adjust themselves. In the case of a wave modulated in a telephone connection, for example, it is very likely that this condition is not always fulfilled, particularly in the case of small frequency deviations and high central frequencies. As is shown in FIG. 5, a pilot wave of very low frequency may be superimposed on the modulation signal via the circuit M*od*, said wave being supplied by the pilot oscillator OP. In this case the signal supplied by the circuit M*od* is transmitted to the inputs of the two switching circuits C*r*1 and C*r*2. The other elements of FIG. 5 and also the elements not shown are identical to those of FIG. 1 and are designated by the same references.

Figure 6:
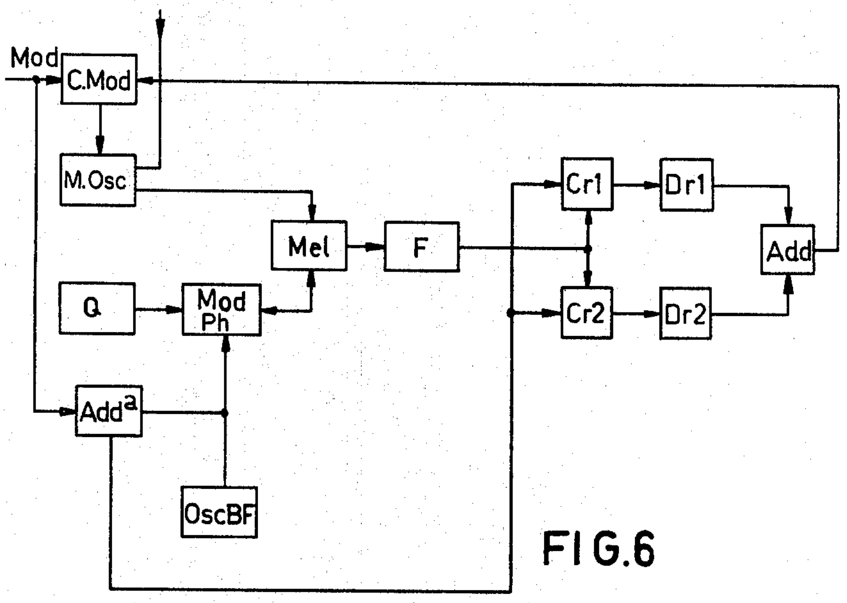
FIG. 6 shows the principal diagram of the automatic frequency stabilization circuits in the event of a phase modulation of the reference signal.

If it is objectionable to transmit a pilot wave, the reference wave of the quartz oscillator Q may be phase-modulated, which is illustrated in FIGURE 6. Then a low-frequency oscillator O*sc*BF is available, the output signal of which, as well as the output signal of the quartz oscillator is fed to the input of the circuit M*od*P*h*. The signal obtained at the output of the circuit M*od*P*h* is fed to the input of the mixing circuit M*el*, which is similar to the circuit M*el* of FIG. 1. The modulation signal M*od* and the signal supplied by the low-frequency oscillator O*sc*BF are fed to the input of an adder circuit A*dd*[a], the signal obtained from the output thereof being transmitted to the switching circuits C*r*1 and C*r*2 to control the commutation. The other circuits of FIG. 6 are similar to those of FIG. 1. which are designated by the same references.

With the three embodiments described above the signals obtained from the outputs of the detection circuits D*r*1 and D*r*2 are added in the circuit A*dd*, which supplies a signal, the amplitude and phase of which are characteristic of the amplitude and the direction of the shift respectively, which prevail initially between the frequencies F and F*o*. Said signal is transmitted to the control-modulation circuit CM*od* and brings about a readjustment of the required frequency in the desired sense.

As a matter of course, the foregoing should be considered only as an example and each automatic stabilization circuit for a frequency modulated wave, in which the principle is based on the interrogation of the frequency difference between a reference signal and the modulated signal by the determination of an amplitude difference, derived from the difference between the limit frequencies of the beat signal obtained by mixing the two signals lies within the scope of the invention.

What is claimed is:

1. An automatic frequency stabilized frequency-modulation generator comprising, a master oscillator, control circuit means responsive to a modulation signal for controlling the frequency of the master oscillator as a function thereof, a stable reference oscillator, means responsive to the master oscillator and the stable reference oscillator for providing a beat frequency signal corresponding to the instantaneous frequency difference therebetween, first circuit means responsive to the beat frequency signal for providing an amplitude attenuation which varies inversely to the frequency of the signal applied, second circuit means responsive to the attenuated signal and the modulation signal for providing a control signal corresponding to the difference between the beat signal average value during successive half cycles of the modulation signal, and means for applying said control signal to the control circuit means for regulating the master oscillator frequency to cause the difference between the beat signal average value during successive half cycles of the modulation signal to be reduced to zero at which point the master oscillator center frequency equals the stable reference oscillator frequency.

2. An automatic frequency stabilized frequency-modulation generator as set forth in claim 1 in which said second circuit means comprises first and second switches connected between the first circuit means and first and second detectors, respectively, said first and second switches responding to the modulation signal for passing the signal from the first circuit means during positive and negative peaks, respectively, of the modulation signals, and circuit means responsive to the first and second detectors for combining the signals therefrom to provide the control signal which corresponds to the difference between the beat signal average value during successive half cycles of the modulation signal.

3. An automatic frequency stabilized frequency-modulation generator as set forth in claim 2 in which the first and second detectors have a high time constant relative to the modulation signal frequency.

4. An automatic frequency stabilized frequency-modulation generator comprising, a master oscillator, a stable reference oscillator, a low frequency oscillator, means for modulation of the low frequency oscillations by the modulation signal, control circuit means responsive to the modulated low frequency oscillations for controlling the frequency of the master oscillator as a function thereof, means responsive to the master oscillator and the stable reference oscillator for providing a beat frequency signal corresponding to the instantaneous frequency difference therebetween, first circuit means responsive to the beat frequency signal for providing an amplitude attenuation which varies inversely to the frequency of the applied signal, second circuit means responsive to the attenuated signal and the modulated low frequency oscillations for providing a control signal corresponding to the difference between the beat signal average value during successive half cycles of the modulated low frequency oscillations and means for applying said control signal to the control circuit means for regulating the master oscillator frequency to cause the difference between the beat signal average value during successive half cycles of the modulated low frequency oscillations to be reduced to zero at which point the master oscillator center frequency equals the stable reference oscillator frequency.

5. An automatic frequency stabilized frequency-modulation generator as set forth in claim 4 in which said second circuit means comprises first and second switches connected between the first circuit means and first and second detectors, respectively. said first and second switches responding to the modulated low frequency oscillations for passing the signal from the first circuit means during positive and negative peaks, respectively, of the modulated low frequency oscillations, and circuit means responisve to the first and second detectors for combining the signals therefrom to provide the control signal which corresponds to the difference between the beat signal average value during successive half cycles of the modulated low frequency oscillations.

6. An automatic frequency stabilized frequency-modulation generator as set forth in claim 5 in which the first and second detectors have a high time constant relative to the modulated low frequency oscillations.

7. An automatic frequency stabilized frequency-modulation generator comprising, a master oscillator, control circuit means responsive to a modulation signal for controlling the frequency of the master oscillator as a function thereof, a stable reference oscillator, a low frequency oscillator, first circuit means responsive to the stable reference oscillator and to the low frequency oscillator for altering the reference oscillator frequency as a function of the low frequency oscillator, second circuit means responsive to the modulation signal and the low frequency oscillator for altering the modulation signal frequency as a function of the low frequency oscillator, third circuit means responsive to the master oscillator and the first circuit means for providing a beat frequency signal corresponding to the instantaneous frequency difference between the signals supplied, fourth circuit means responsive to the beat frequency signal for providing an amplitude attenuation which varies inversely to the beat signal frequency, fifth circuit means responsive to the attenuated beat signal and the second circuit means for providing a control signal corresponding to the difference between the beat signal average value during successive half cycles of the signal from the second circuit means and means for applying said control signal to the control circuit means for regulating the master oscillator frequency to cause the difference between the beat signal average value during successive half cycles of the signal from the second circuit means to be reduced to zero at which point the master oscillator center frequency equals the stable reference oscillator frequency.

8. An automatic frequency stabilized frequency-modulation generator as set forth in claim 7 in which said fifth circuit means comprises first and second switches connected between the first circuit means and first and second detectors, respectively, said first and second switches responding to the second circuit means for passing the signal from the fourth circuit means during positive and negative peaks, respectively, of the signal from the second circuit means, and circuit means responsive to the first and second detectors for combining the signals therefrom to provide the control signal which corresponds to the difference between the beat signal average value during successive half cycles of the signal from the second circuit means.

9. An automatic frequency stabilized frequency-modulation generator as set forth in claim 8 in which the first and second detectors have a high time constant relative to the frequency of the signal from the second circuit means.

References Cited by the Examiner

UNITED STATES PATENTS

| | | | |
|---|---|---|---|
| 2,725,555 | 11/1955 | Hopper | 331—23 |
| 2,986,631 | 5/1961 | Jose et al. | 325—148 |

DAVID G. REDINBAUGH, *Primary Examiner.*